US007259201B2

(12) United States Patent
Gallucci et al.

(10) Patent No.: US 7,259,201 B2
(45) Date of Patent: Aug. 21, 2007

(54) FLAME RETARDANT THERMOPLASTIC FILMS AND METHODS OF MAKING THE SAME

(75) Inventors: Robert R. Gallucci, Mount Vernon, IN (US); William Kernick, Niskayuna, NY (US); Jeroen Vervoort, Siegsdorf (DE)

(73) Assignee: General Electric Company, Schenectady, NY (US)

( * ) Notice: Subject to any disclaimer, the term of this patent is extended or adjusted under 35 U.S.C. 154(b) by 71 days.

(21) Appl. No.: 10/869,231

(22) Filed: Jun. 15, 2004

(65) Prior Publication Data

US 2005/0048299 A1 Mar. 3, 2005
US 2006/0078751 A9 Apr. 13, 2006

Related U.S. Application Data

(60) Provisional application No. 60/499,215, filed on Aug. 28, 2003.

(51) Int. Cl.
*C08K 5/42* (2006.01)
(52) U.S. Cl. ............... 524/165; 524/157; 428/458; 264/176.1; 264/204
(58) Field of Classification Search ......... 524/157, 524/165; 428/458; 264/176.1, 204
See application file for complete search history.

(56) References Cited

U.S. PATENT DOCUMENTS

| 2,991,273 | A | | 7/1961 | Hechelhammer et al. |
| 3,271,367 | A | | 9/1966 | Schnell et al. |
| 3,271,368 | A | | 9/1966 | Goldberg et al. |
| 3,383,092 | A | | 5/1968 | Cazier .................. 253/40 |
| 3,539,657 | A | | 11/1970 | Noshay et al. ........... 260/824 |
| 3,634,355 | A | | 1/1972 | Barr et al. ............. 260/49 |
| 3,671,487 | A | | 6/1972 | Abolins ............... 260/40 R |
| 3,723,373 | A | | 3/1973 | Lucas .................. 260/29.6 F |
| 3,803,085 | A | | 4/1974 | Takehoshi et al. ...... 260/46.5 E |
| 3,847,867 | A | | 11/1974 | Heath et al. .......... 260/47 CP |
| 3,850,885 | A | | 11/1974 | Takekoshi et al. ...... 260/47 CZ |
| 3,852,242 | A | | 12/1974 | White ................ 260/47 CZ |
| 3,855,178 | A | | 12/1974 | White et al. ............. 260/45.7 |
| 3,905,942 | A | | 9/1975 | Takekoshi et al. ...... 260/47 CP |
| 3,971,756 | A | | 7/1976 | Bialous et al. |
| 3,972,902 | A | | 8/1976 | Heath et al. .......... 260/346.3 |
| 3,983,093 | A | | 9/1976 | Williams, III et al. .. 260/47 CP |
| 4,008,203 | A | | 2/1977 | Jones ..................... 260/49 |
| 4,108,837 | A | | 8/1978 | Johnson et al. ......... 528/126 |
| 4,175,175 | A | | 11/1979 | Johnson et al. ......... 528/125 |
| 4,176,222 | A | | 11/1979 | Cinderey et al. ......... 528/126 |
| 4,256,862 | A | | 3/1981 | Binsack et al. .......... 525/534 |
| 4,387,193 | A | | 6/1983 | Giles |
| 4,443,591 | A | | 4/1984 | Schmidt et al. .......... 528/128 |
| 4,455,410 | A | | 6/1984 | Giles, Jr. ................ 525/436 |
| 4,468,506 | A | | 8/1984 | Holub et al. |
| 4,518,997 | A | | 5/1985 | Beckman ................. 358/198 |
| 4,543,368 | A | | 9/1985 | Smearing et al. |
| 4,629,759 | A | | 12/1986 | Rock ......................... 525/66 |
| 4,690,997 | A | | 9/1987 | Cella et al. ............. 528/26 |
| 4,808,686 | A | | 2/1989 | Cella et al. ............. 528/27 |
| 4,826,916 | A | | 5/1989 | Policastro et al. ....... 524/755 |
| 4,908,418 | A | | 3/1990 | Holub ..................... 525/425 |
| 4,908,419 | A | | 3/1990 | Holub et al. ............. 525/425 |
| 4,918,125 | A | | 4/1990 | Boutni |
| 4,981,894 | A | | 1/1991 | Nye et al. ............... 524/401 |
| 5,026,767 | A | * | 6/1991 | Inoue et al. ............. 524/745 |
| 5,026,890 | A | | 6/1991 | Webb et al. ............. 556/408 |
| 5,028,681 | A | | 7/1991 | Peters ..................... 528/27 |
| 5,051,483 | A | | 9/1991 | Rock et al. .............. 525/425 |
| 5,095,054 | A | * | 3/1992 | Lay et al. ................ 524/47 |
| 5,104,958 | A | | 4/1992 | Bolon et al. ............. 528/26 |
| 5,130,192 | A | * | 7/1992 | Takabayashi et al. ....... 428/332 |
| 5,280,085 | A | | 1/1994 | Rock et al. .............. 525/393 |
| 5,314,754 | A | * | 5/1994 | Knight ................... 428/532 |
| 5,521,258 | A | | 5/1996 | Cooper et al. ........... 525/425 |
| 5,986,016 | A | | 11/1999 | Puyenbroek et al. |
| 6,365,710 | B1 | * | 4/2002 | Wang et al. ............. 528/480 |
| 6,417,255 | B1 | | 7/2002 | Penning et al. |
| 6,727,302 | B2 | | 4/2004 | Goossens et al. |
| 6,730,720 | B2 | | 5/2004 | Gohr et al. |
| 2005/0038145 | A1 | * | 2/2005 | Gallucci et al. .......... 524/157 |
| 2005/0131105 | A1 | | 6/2005 | Choate et al. |
| 2006/0014919 | A9 | | 1/2006 | Venderbosch et al. |

FOREIGN PATENT DOCUMENTS

CA          847963          7/1970 ............... 402/359

(Continued)

OTHER PUBLICATIONS

ASTM D1238-01, "Standard Test Method for Melt Flow Rates of Thermoplastics by Extrusion Plastometer", 12 pages.

(Continued)

*Primary Examiner*—Peter Szekely
(74) *Attorney, Agent, or Firm*—Cantor Colburn LLP

(57) ABSTRACT

A film can comprise greater than or equal to about 95 wt % thermoplastic resin and about 0.001 wt % to about 5.0 wt % sulfonate salt, based on a total weight of the film, and have a UL-94 rating of VTM-0, wherein the thermoplastic resin is selected from the group consisting of polyimide, polysulfone, and copolymers, reaction products, and combinations comprising at least one of the foregoing thermoplastic resins.

25 Claims, 2 Drawing Sheets

FOREIGN PATENT DOCUMENTS

EP    0293904 A2    7/1988
WO    8202895       9/1982

OTHER PUBLICATIONS

Standard Test Method for Haze and Luminous Transmittance of Transparent Plastics—ASTM D1003-00; pp. 202-207.
Standard Test Method for Transition Temperatures of Polymers By Differential Scanning Calorimetry—ASTM D3418-99; pp. 337-341.
Standard Specification for Sulforne Plastics (SP) ASTM D6394-02; pp. 984-987.
UL 94 Standards for Safety; Tests for Flammability of Plastic Materials for Parts in Devices and Appliances; pp. 13-17.
United States Patent Application entitled: "Flame Retardant Fiber Reinforced Composition with Improved Flow"; U.S. Appl. No. 10/638,631; filed: Aug. 1, 2003; 38 pages.
International Search Report, International Application No. PCT/US2004/026180, International Filing Date: Aug. 12, 2004, Date of Mailing Nov. 25, 2004, 6 pages.

* cited by examiner

FLAME RETARDANT THERMOPLASTIC FILMS AND METHODS OF MAKING THE SAME

CROSS REFERENCE TO RELATED APPLICATIONS

This application claims the benefit of Provisional Application Ser. No. 60/499,215, filed Aug. 28, 2003, with is incorporated herein in its entirety.

BACKGROUND OF THE INVENTION

Since high $T_g$ (glass transition temperature) thermoplastic resins (e.g., $T_g$ of greater than or equal to about 180° C.) are processed at high temperatures, many standard additives that are used to flame retard other resins are unstable, decomposing under the high process temperatures needed to melt process the viscous high $T_g$ amorphous thermoplastics. The decomposition of standard flame retardant (FR) additives during melt processing, as well as the detrimental effects such decomposition products can have upon the resin and the equipment, is a problem. This is true of amorphous polyetherimide (PEI) and polysulfone (PSU) resins that have high $T_g$ and high viscosity making them more difficult to melt process than crystalline resins or lower $T_g$ amorphous resins. Efforts to improve the flame retardancy of PEI by forming blends with additional materials such as brominated polycarbonate, aliphatic bominated or chlorinated compounds, and hydrated inorganic compounds like aluminum trihydrate and some alkyl phosphates, are ineffective due to decomposition or volatilization of the flame retardant additive.

A particular flame retardancy deficiency has been noted in PEI and polysulfone films having a thickness of 25 micrometers to 300 micrometers (e.g., films used in applications such as electronics). Hence, PEI and polysulfone films have need of improved flame retardant performance. These thin films have a relatively high surface area that is exposed to air, making the combustion process more favorable than in thicker sections. Electronic specifications often require the film to exhibit sufficient flame retardancy such as that specified in UL-94 (Underwriter's Laboratory Bulletin 94 entitled "Tests for Flammability of Plastic Materials, UL-94"). A rating of VTM-0 is desirable in many applications. Polyetherimide and polysulfone thin films, however, often only attain a UL-94 rating of VTM-1 or VTM-2. Various unsuccessful attempts have been made at improving the flame retardancy rating and ignition resistance of the film while retaining the melt processability, good mechanical and electrical properties, and transparency of the PEI, PSU, and polyethersulfone (PES) films. Therefore, there remains a need to produce polyetherimide and polysulfone films having a thickness of about 25 micrometers to about 300 micrometers while attaining a UL-94 rating of VTM-0.

BRIEF DESCRIPTION OF THE INVENTION

Disclosed herein are films and methods of making the same. In one embodiment, a film can comprise greater than or equal to about 95 wt % thermoplastic resin and about 0.001 wt % to about 5.0 wt % sulfonate salt, based on a total weight of the film, and have a UL-94 rating of VTM-0, wherein the thermoplastic resin is selected from the group consisting of polyimide, polysulfone, and copolymers, reaction products, and combinations comprising at least one of the foregoing thermoplastic resins.

In another embodiment, a film can comprise the reaction product of greater than or equal to about 95 wt % thermoplastic resin and about 0.001 wt % to about 5.0 wt % sulfonate salt, based on a total weight of the film, and have a UL-94 rating of VTM-0, wherein the thermoplastic resin is selected from the group consisting of polyimide, polysulfone, and copolymers, reaction products, and combinations comprising at least one of the foregoing thermoplastic resins.

In one embodiment, the method for producing a film using melt processing, comprises: melting a thermoplastic resin and a sulfonate salt to form a melt and passing the melt through a die to produce the film, wherein the thermoplastic resin is selected from the group consisting of polyimide, polysulfone, and copolymers, reaction products, and combinations comprising at least one of the foregoing thermoplastic resins, and wherein the thermoplastic resin is present in an amount of greater than or equal to about 95 wt %, and the sulfonate salt is present in an amount of about 0.001 wt % to about 5.0 wt %, based upon the combined weight of the melts.

The above described and other features are exemplified by the following detailed description.

DESCRIPTION OF THE DRAWINGS

Referring to the drawings, which are meant to be exemplary and not limiting.

DETAILED DESCRIPTION OF THE INVENTION

Figure 1:
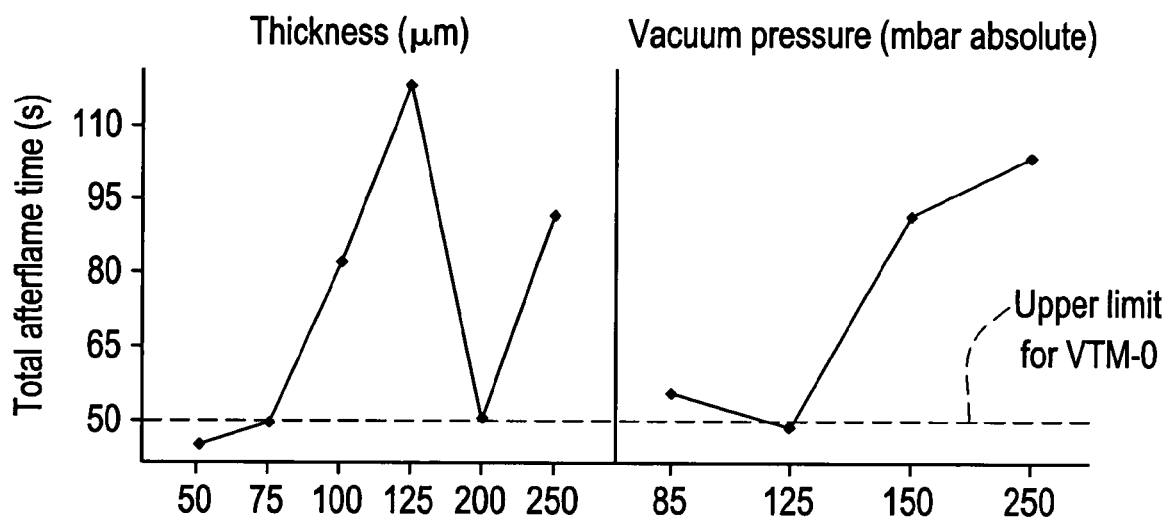
FIG. 1 is a graphical illustration of total flame out time for all samples tested versus thickness and vacuum pressure for PEI film as determined in accordance with UL-94 testing standards.

Disclosed herein is a composition and method for making a flame retardant thermoplastic amorphous resin. It is noted that the terms "a" and "an" herein do not denote a limitation of quantity, but rather denote the presence of at least one of the referenced item. Additionally, all ranges disclosed herein are inclusive and combinable (e.g., the ranges of "up to 25 wt %, with 5 wt % to 20 wt % desired," are inclusive of the endpoints and all intermediate values of the ranges of "5 wt % to 25 wt %," etc.).

The thermoplastic resin, for example, can be polyimide (e.g., polyetherimide (PEI), or the like), polyetherimide sulfones (PEIS), polyimide copolymers, polysulfone (PSU), polyethersulfone (PES), polyphenylene sulfone (PPSU), and copolymers, reaction products, and combinations comprising at least one of the foregoing thermoplastic resins.

Specifically, the thermoplastic resin can have a high purity (e.g., greater than or equal to about 95 wt % of the thermoplastic resin based on the total weight of the composition), and a high $T_g$ (i.e., greater than or equal to about 180° C., such as a $T_g$ of about 180° C. to about 350° C.). The desired flame retardancy can be imparted via the addition of a sulfonate salt and/or via the use of a vacuum pressure of less than or equal to about 125 millibars (mbar) absolute during the formation of the film. Vacuum treatment of the resin can be performed during a melt processing of the resin to prepare the film. This film, although having a thickness of about 25 micrometers to about 350 micrometers (desirably about 50 micrometers to about 250 micrometers), attains a UL-94 rating of VTM-0.

There are two aspects of the UL-94 measurement of flammability discussed here. The total flameout time (TFOT) or total after flame time (TAFT) is the sum of the time, in seconds (s), that all the samples remained ignited after two separate applications of a flame as described in UL-94 VTM test. The usual VTM test involves 5 samples. The average total flameout time (ATFOT) is the TFOT divided by the number of samples. The ATFOT is a per specimen value. The TFOT or TAFT is an aggregate value of all samples tested. In either case shorter time periods indicate better flame resistance, i.e., the flame went out faster. For a UL-94 VTM-0 rating the total flaming combustion time (TFOT or TFAT) for all five samples, each having two applications of flame, will not exceed 50 seconds. Also no individual sample will have a combustion time exceeding 10 seconds. Individual combustion time is reflected in the ATFOT.

The sulfonate salt can be any sulfonate salt capable of attaining a VTM-0 rating in high $T_g$ thermoplastic resins for all film thicknesses of about 25 micrometers to 200 about micrometers, and even to about 300 micrometers. Exemplary sulfonate salts include fluoroalkyl sulfonate salts, aryl sulfonate salts, alkyl aryl sulfonate salts, and combinations comprising at least one of the foregoing sulfonate salts. In some particular embodiments suitable salts of sulfonic acids include those having the following formulas:

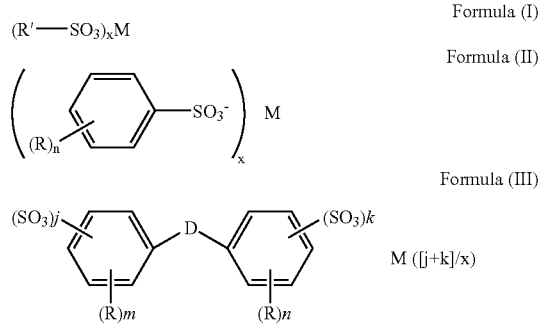

Formula (I): $(R'—SO_3)_xM$

Formula (II): M

Formula (III): M ([j+k]/x)

where R' may be $C_1$-$C_{40}$ alkyl, or $C_1$-$C_{40}$ fluoroalkyl, desirably $C_4$-$C_8$ perfluoroalkyl group(s). R is, independently for each substitution, a one to forty carbon atom alkyl group or alkyl-, arylalkyl- or aromatic ether group; M is an alkali metal(s), an alkaline earth metal(s), or a combination comprising at least one of the foregoing metals; x is the oxidation state of the metal, M; and j, k, m, and n are each integers from 0 to 5 subject to the limitation that j+k is at least 1 and subject to the further limitation that j+m is less than or equal to 5 and k+n is less than or equal to 5. In some particular embodiments j is zero and k is one. R can be an alkyl group having 3 to 40 carbon atoms, specifically 4 to 20 carbon atoms, and more specifically 4 to 12 carbon atoms. The linking group D is typically —$SO_2$— or —O—. The metals can be the Group IA or Group IIA metals in the Periodic Table of Elements, and more specifically, sodium and/or potassium.

In some particular embodiments suitable sulfonate salts comprise perfluoroalkyl (alkali metal/alkaline earth metal) sulfonate salts, e.g., perfluorobutyl potassium sulfonate salt (KPFBS). Other possible sulfonate salts include potassium sulfone sulfonate (KSS), sodium benzene sulfonate, and sodium dodecylbenzene sulfonate (NaDBS). Desirably, the perfluoroalkyl alkaline metal/alkaline earth metal sulfonate salts have less than or equal to eight carbon atoms. Mixtures comprising at least one of any of the above mentioned sulfonate salts may also be employed.

Generally, the sulfonate salt(s) are present in the composition in an amount of less than or equal to about 5.0 weight percent (wt %), e.g., about 0.001 wt % to about 5.0 wt %, based upon the total weight of the composition, specifically, about 0.005 wt % to about 3.0 wt %, more specifically about 0.01 wt % to about 2.0 wt %, even more specifically about 0.01 wt % to about 1.0 wt %, yet more specifically about 0.025 wt % to about 0.5 wt %, and even more specifically about 0.025 wt % to about 0.08 wt %. All weight percents discussed herein are based upon the total weight of the film unless otherwise specified.

The composition may also optionally include a fluoropolymer in an amount effective to provide anti-drip properties to the resin composition, e.g., of about 0.01 wt % to about 2.0 wt % fluoropolymer. Addition of the fluoropolymer, while making the film less prone to dripping during application of a flame, may increase haze and reduce transparency of a clear resin. Some possible examples of suitable fluoropolymers and methods for making such fluoropolymers are set forth, for example, in U.S. Pat. Nos. 3,671,487, 3,723,373, and 3,383,092. Fluoropolymers include homopolymers and copolymers that comprise structural units derived from one or more fluorinated alpha-olefin monomers. The term "fluorinated alpha-olefin monomer" means an alpha-olefin monomer that includes at least one fluorine atom substituent. Some fluorinated alpha-olefin monomers include, for example, fluoroethylenes such as, for example, $CF_2=CF_2$, $CHF=CF_2$, $CH_2=CF_2$, and $CH_2=CHF$; and/or fluoropropylenes such as, for example, $CF_3CF=CF_2$, $CF_3CF=CHF$, $CF_3CH=CF_2$, $CF_3CH=CH_2$, $CF_3CF=CHF$, $CHF_2CH=CHF$, and $CF_3CF=CH_2$.

Some fluorinated alpha-olefin copolymers include copolymers comprising structural units derived from two or more fluorinated alpha-olefin monomers such as, for example, poly(tetrafluoroethylene-hexafluoroethylene), and copolymers comprising structural units derived from one or more fluorinated monomers and one or more non-fluorinated monoethylenically unsaturated monomers that are copolymerizable with the fluorinated monomers such as, for example, poly(tetrafluoroethylene-ethylene-propylene) copolymers. Non-fluorinated monoethylenically unsaturated monomers include for example, alpha-olefin monomers such as, for example, ethylene, propylene, butene, and the like.

Polyimides have the general Formula (IV):

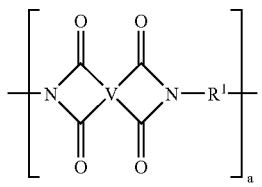

wherein a is more than 1, typically about 10 to about 1,000 or more, and can specifically be about 10 to about 500; and wherein V is a tetravalent linker without limitation, as long as the linker does not impede synthesis or use of the polyimide. Suitable linkers include, but are not limited to: (a) substituted or unsubstituted, saturated, unsaturated or aromatic monocyclic and polycyclic groups having about 5 to about 50 carbon atoms, (b) substituted or unsubstituted, linear or branched, saturated or unsaturated alkyl groups having 1 to about 30 carbon atoms; and combinations comprising at least one of the foregoing linkers. Suitable substitutions and/or linkers include, but are not limited to, ethers, epoxides, amides, esters, and combinations comprising at least one of the foregoing. Exemplary linkers include, but are not limited to, tetravalent aromatic radicals of Formula (V), such as:

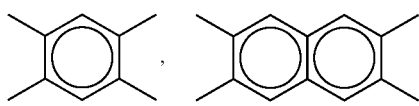

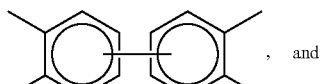

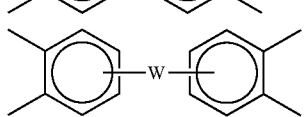

wherein W is a divalent moiety such as —O—, —S—, —C(O)—, —SO$_2$—, —So—, —C$_y$H$_{2y}$— (y being a integer of 1 to 5), and halogenated derivatives thereof, including perfluoroalkylene groups, or a group of the Formula —O—Z—O— wherein the divalent bonds of the —O— or the —O—Z—O— group are in the 3,3', 3,4', 4,3', or the 4,4' positions, and wherein Z includes, but is not limited, to divalent radicals of Formula (VI):

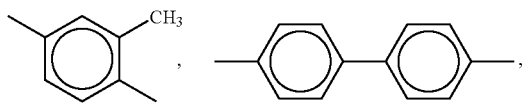

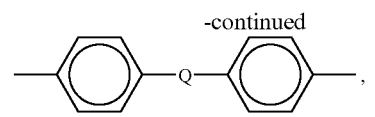

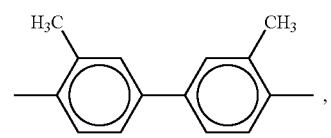

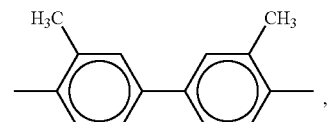

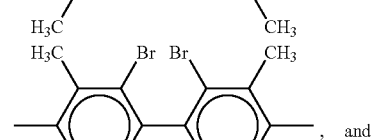

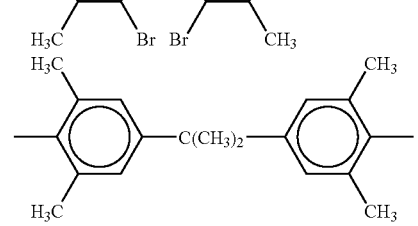

wherein Q includes, but is not limited to, a divalent moiety comprising —O—, —S—, —C(O)—, —SO$_2$—, —SO—, —C$_y$H$_{2y}$— (y being an integer from 1 to 5) and halogenated derivatives thereof, including perfluoroalkylene groups.

R$^1$ in formula (IV) includes, but is not limited to, substituted or unsubstituted divalent organic radicals such as: aromatic hydrocarbon radicals having about 6 to about 20 carbon atoms and halogenated derivatives thereof; straight or branched chain alkylene radicals having about 2 to about 20 carbon atoms; cycloalkylene radicals having about 3 to about 20 carbon atoms; or divalent radicals of the general formula (VII)

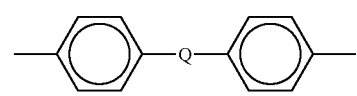

wherein Q is defined as above.

Exemplary classes of polyimides include, but are not limited to, polyamidimides and polyetherimides, particularly those polyetherimides that are melt processable, such as those whose preparation and properties are described in U.S. Pat. Nos. 3,803,085 and 3,905,942.

Polyetherimide resins comprise more than 1, typically about 10 to about 1,000 or more, and more specifically about 10 to about 500 structural units, of the Formula (VIII):

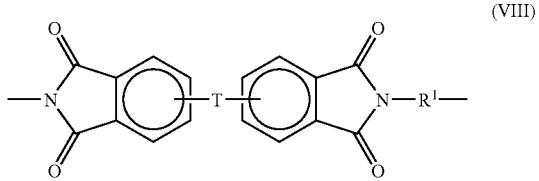

(VIII)

wherein T is —O— or a group of the Formula —O—Z—O— wherein the divalent bonds of the —O— or the —O—Z—O— group are in the 3,3', 3,4', 4,3', or the 4,4' positions, and wherein Z and $R^1$ are defined as described above.

The polyetherimide can be prepared by any of a variety of methods, including the reaction of an aromatic bis(ether anhydride) of the Formula (IX)

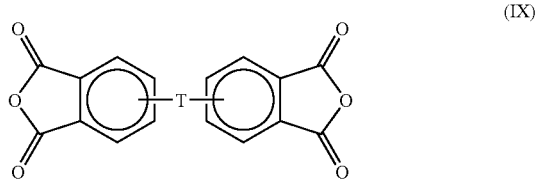

(IX)

with an organic diamine of the Formula (X)

$$H_2N—R^1—NH_2 \quad (X)$$

wherein $R^1$ and T are defined in relation to Formulas (IV) and (VIII), respectively.

Examples of specific aromatic bis(ether anhydride)s and organic diamines are disclosed, for example, in U.S. Pat. Nos. 3,972,902 and 4,455,410. Illustrative examples of aromatic bis(ether anhydride)s of Formula (IX) include: 2,2-bis[4-(3,4-dicarboxyphenoxy)phenyl]propane dianhydride; 4,4'bis(3,4-dicarboxyphenoxy)diphenyl ether dianhydride; 4,4'-bis(3,4-dicarboxyphenoxy)diphenyl sulfide dianhydride; 4,4'-bis(3,4-dicarboxyphenoxy)benzophenone dianhydride; 4,4'-bis(3,4-dicarboxyphenoxy)diphenyl sulfone dianhydride; 2,2-bis[4-(2,3-dicarboxyphenoxy)phenyl] propane dianhydride; 4,4'-bis(2,3-dicarboxyphenoxy)diphenyl ether dianhydride; 4,4'-bis(2,3-dicarboxyphenoxy) diphenyl sulfide dianhydride; 4,4'-bis(2,3-dicarboxyphenoxy)benzophenone dianhydride; 4,4'-bis(2,3-dicarboxyphenoxy)diphenyl sulfone dianhydride; 4-(2,3-dicarboxyphenoxy)-4'-(3,4-dicarboxyphenoxy)diphenyl-2,2-propane dianhydride; 4-(2,3-dicarboxyphenoxy)-4'-(3,4-dicarboxyphenoxy)diphenyl ether dianhydride; 4-(2,3-dicarboxyphenoxy)-4'-(3,4-dicarboxyphenoxy)diphenyl sulfide dianhydride; 4-(2,3-dicarboxyphenoxy)-4'-(3,4-dicarboxyphenoxy)benzophenone dianhydride and 4-(2,3-dicarboxyphenoxy)-4'-(3,4-dicarboxyphenoxy)diphenyl sulfone dianhydride, as well as mixtures comprising at least two of the foregoing. More specifically, the dianhydride can be bis[3,4dicarboxyphenoxy) phenyl]propane dianhydride (BPA-DA), pyromellitic dianhydride, oxydiphthalic anhydride (ODPA), as well as mixtures and combinations comprising at least one of the foregoing dianhydrides. Specifically, aryl dianhydrides free of benzylic protons are preferred for better melt stability.

The bis(ether anhydride)s can be prepared by the hydrolysis, followed by dehydration, of the reaction product of a nitro substituted phenyl dinitrile with a metal salt of dihydric phenol compound in the presence of a dipolar, aprotic solvent. A preferred class of aromatic bis(ether anhydride)s included by Formula (IX) above includes, but is not limited to, compounds wherein T is of the Formula (XI):

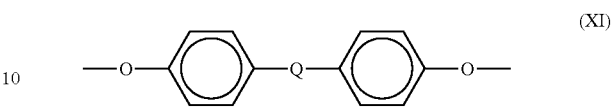

(XI)

and the ether linkages, for example, can be in the 3,3', 3,4', 4,3', or 4,4' positions, and mixtures comprising at least one of the foregoing, and where Q is as defined above.

Any diamino compound may be employed. Examples of suitable compounds are ethylenediamine, propylenediamine, trimethylenediamine, diethylenetriamine, triethylenetertramine, hexamethylenediamine, heptamethylenediamine, octamethylenediamine, nonamethylenediamine, decamethylenediamine, 1,12-dodecanediamine, 1,18-octadecanediamine, 3-methylheptamethylenediamine, 4,4-dimethylheptamethylenediamine, 4-methylnonamethylenediamine, 5-methylnonamethylenediamine, 2,5-dimethylhexamethylenediamine, 2,5-dimethylheptamethylenediamine, 2,2-dimethylpropylenediamine, N-methyl-bis (3-aminopropyl) amine, 3-methoxyhexamethylenediamine, 1,2-bis(3-aminopropoxy) ethane, bis(3-aminopropyl) sulfide, 1,4-cyclohexanediamine, bis-(4-aminocyclohexyl) methane, m-phenylenediamine, p-phenylenediamine, 2,4-diaminotoluene, 2,6-diaminotoluene, m-xylylenediamine, p-xylylenediamine, 2-methyl-4,6-diethyl-1,3-phenylene-diamine, 5-methyl-4,6-diethyl-1,3-phenylene-diamine benzidine, 3,3 '-dimethylbenzidine, 3,3'-dimethoxybenzidine, 1,5-diaminonaphthalene, bis(4-aminophenyl) methane, bis(2-chloro-4-amino-3, 5-diethylphenyl) methane, bis(4-aminophenyl) propane, 2,4-bis(b-amino-t-butyl) toluene, bis(p-b-amino-t-butylphenyl) ether, bis(p-b-methyl-o-aminophenyl) benzene, bis(p-b-methyl-o-aminopentyl) benzene, 1,3-diamino-4-isopropylbenzene, bis(4-aminophenyl) sulfide, bis (4-aminophenyl) sulfone, and bis(4-aminophenyl) ether. Mixtures comprising at least one of these compounds may also be present. The diamino compounds can, specifically, be aromatic diamines. More specifically, the diamino compounds can be m- and p-phenylenediamine, diamino diphenyl sulfone (DDS) and mixtures comprising at least one of these compounds. Specifically, aryl diamines free of benzylic protons are preferred for better melt stability.

The polyetherimide resin can comprise structural units according to Formula (VIII) wherein each $R^1$ is independently diphenyl sulfone, p-phenylene or m-phenylene or a mixture thereof and T is a divalent radical of the Formula (XII):

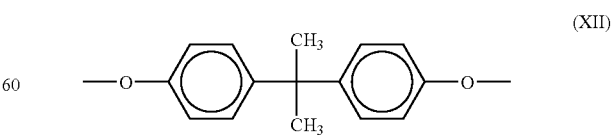

(XII)

Included among the many methods of making the polyimides, particularly polyetherimides, are those disclosed in U.S. Pat. Nos. 3,847,867, 3,850,885, 3,852,242, 3,855,178, 3,983,093, and 4,443,591.

In general, the reactions can be carried out employing various solvents, e.g., o-dichlorobenzene, m-cresol/toluene, and the like, to effect a reaction between the anhydrides of Formula (IX) and the diamines of Formula (X), at temperatures of about 100° C. to about 250° C. Alternatively, the polyetherimide can be prepared by melt polymerization or interfacial polymerization, e.g., melt polymerization of aromatic bis(ether anhydride)s and diamines by heating a mixture of the starting materials to elevated temperatures with concurrent stirring and removal of water. Generally, melt polymerizations employ temperatures of about 200° C. to about 400° C.

Chain stoppers (such as mono anhydrides and mono amines) and branching agents (such as tri- or tetra-functional amines or tri- or tetra functional anhydrides, or tri- and tetra-functional carboxylic acids) may also be employed in the reaction. Specifically, end caps free of benzylic protons can be used for better melt stability. When polyetherimide/polyimide copolymers are employed, a dianhydride, such as pyromellitic anhydride or oxydiphthalic anhydride, is used in combination with BPA-DA. The polyetherimide resins can optionally be prepared from reaction of an aromatic bis(ether anhydride) with an organic diamine in which the diamine is present in the reaction mixture at less than or equal about 0.5 molar excess, or more specifically less than or equal to about 0.2 molar excess.

Generally, useful polyetherimides have a melt index of about 0.1 to about 10 grams per minute (g/min), as measured by American Society for Testing Materials (ASTM) D1238 at 340-370° C., using a 6.6 kilogram (kg) weight. The polymer should be dried prior to testing melt index. The polyetherimide resin can have a weight average molecular weight (Mw) of about 5,000 to about 100,000 grams per mole (g/mole), more specifically a Mw of about 10,000 g/mole to about 60,000 g/mole, as measured by gel permeation chromatography, using a polystyrene standard. Such polyetherimide resins typically have an intrinsic viscosity greater than about 0.2 deciliters per gram (dl/g), preferably about 0.35 to about 0.7 dl/g measured in m-cresol at 25° C. Some such polyetherimides include, but are not limited to, ULTEM XH6050 (a polyetherimide sulfones), ULTEM® 1000, ULTEM® 1010, ULTEM® 1040, (all commercially available from General Electric Advanced Materials), or mixtures comprising at least one of the foregoing.

The polysulfones are thermoplastic polymers that possess a number of attractive features such as high temperature resistance, good electrical properties, and good hydrolytic stability. Various polysulfones can be employed herein, such as polyether sulfones, polyaryl ether sulfones, polyetherethersulfones, polyphenylene ether sulfones, and the like, as well as copolymers, reaction products, and combinations comprising at least one of the foregoing polysulfones. A variety of polyaryl ether sulfones are commercially available, including the polycondensation product of dihydroxydiphenyl sulfone with dichlorodiphenyl sulfone, known as polyethersulfone (PES) resin, and the polymer product of bisphenol A (BPA) and dichlorodiphenyl sulfone, which is a polyethersulfone sometimes referred to as polysulfone (PSF) resin. Polyphenylene ether sulfone (PPSU) made from biphenol and dichloro diphenyl sulfone can also be employed especially where high impact is desired. A variety of polyether sulfone copolymers, for example comprising bisphenol A and other bisphenols moieties and diphenyl sulfone moieties in molar ratios other than 1:1, can also be used.

Other polyaryl ether sulfones include polybiphenyl ether sulfone resins, such as those available from Solvay S. A. Inc. under the trademark of RADEL R resin. This resin may be described as the polycondensation product of biphenol with 4,4'-dichlorodiphenyl sulfone and also described, for example, in Canadian Patent No. 847,963.

Methods for the preparation of polysulfones include the carbonate method and the alkali metal hydroxide method. In the alkali metal hydroxide method, a double alkali metal salt of a dihydroxy-substituted aromatic hydrocarbon is contacted with a dihalobenzenoid compound in the presence of a dipolar, aprotic solvent under substantially anhydrous conditions. In the carbonate method at least one dihydroxy-substituted aromatic hydrocarbon and at least one dihalobenzenoid compound are heated, for example, with sodium carbonate or bicarbonate and a second alkali metal carbonate or bicarbonate as disclosed, for example, in U.S. Pat. No. 4,176,222. Alternatively, the polybiphenyl ether sulfone, PSF and PES resin components may be prepared by any of the variety of methods used for the preparation of polyaryl ether resins. Thermoplastic polyethersulfones and methods for their preparation are also described, for example, in U.S. Pat. Nos. 3,634,355; 4,008,203; 4,108,837; and 4,175,175. Polysulfones made by any process may be used to make the flame retardant films.

The weight average molecular weight of the polysulfone is indicated by reduced viscosity data in an appropriate solvent such as methylene chloride, chloroform, N-methyl pyrrolidinone, or the like. The intrinsic viscosity of the polysulfone can be greater than or equal to about 0.3 deciliters per gram (dl/g), typically about 0.3 dl/g to about 1.5 dl/g, with greater than or equal to about 0.4 dl/g preferred. Examples of some suitable polysulfones are described, for example, in ASTM D6394. The above described polysulfones and polysulfone copolymers may be employed alone or in combinations comprising at least one of the foregoing.

The amount of the thermoplastic resin (e.g., polyimides, polyetherimide sulfones, polysulfones, copolymers, and mixtures) can be present in the composition in amounts of greater than or equal to about 90 wt %, specifically greater than or equal to about 95 wt %, and more specifically greater than or equal to about 97 wt %. Optionally, the composition can consist essentially of greater than or equal to about 97 wt % thermoplastic resin and about 0.001 wt % to about 0.1 wt % sulfonate salt. In another embodiment, the composition can comprise greater than or equal to about 97 wt % thermoplastic resin, about 0.001 wt % to about 1.0 wt % sulfonate salt, less than or equal to about 2,500 parts per million by weight (ppm) bromine and/or less than or equal to about 2,500 ppm chlorine, and optionally, about 0.01 wt % to about 2.0 wt % fluoropolymer. More specifically, the composition (and film) can comprise less than or equal to about 1,000 ppm bromine and/or less than or equal to about 1,000 ppm chlorine.

The composition (i.e., the resin, the sulfonate salt, and optionally the fluoropolymer) can be formed prior to the formation of the film. For example, the composition can be prepared and formed into pellets. The pellets may then be melt processed into the desired film. To further enhance the flame retardancy of the film, a vacuum can be employed during the melt processing wherein the vacuum is at a pressure of less than or equal to about 125 mbars absolute. In this process, pellets (e.g., the composition or just the resin pellets) are added to an extruder or the like. If resin pellets are employed, the sulfonate salt (and optionally the fluoropolymer) is preferably also added to the throat of the extruder at the time of adding the resin pellets. Within the extruder, the pellets are melt processed by heating to above the glass transition temperature ($T_g$) of the pellets. In one embodiment, to facilitate processing and flow of the melt, the pellets can be heated to about 250° C. to about 325° C. It is desirable to dry the polyimide or polysulfone prior to melt processing to remove any absorbed water or other volatile species. Drying may be done under air, nitrogen or vacuum. Drying temperatures may be, for example, about 125° C. to about 175°C.

A vacuum may optionally be applied to the melt to remove gasses therefrom, e.g., at least once the pellets have melted. The vacuum pressure of less than or equal to about 125 mbar absolute can be applied to the melt. The melt can then be extruded through a die. From the die the extrudate may be directed through rollers to produce the desired film (e.g., a substantially uniformly thick film, such as a film having a thickness of 25 micrometers to about 750 micrometers, and cooled, actively or passively. The resultant film possesses improved flame retardancy. For example, the film has a reduced total flame out time (TFOT) or average total flame out time (ATFOT) as compared to a film processed in the same fashion without the sulfonate salt, and/or a film of the same composition (neither with sulfonate salt) processed at a pressure of greater than or equal to about 125 mbar absolute. The composition and the processing can reduce the average total flame out time to less than or equal to about 10 seconds (s), with less than or equal to about 5 seconds possible, compared to a film that was not vacuum processed and/or does not comprise the sulfonate salt. An average flame out time of less than or equal to 10 seconds per specimen, and a total flame out time of less than or equal to 50 seconds is needed to achieve a UL-94 VTM-0 rating.

In some applications the clarity of the flame retardant film is important. There are two important components of transparency; namely the light transmitted through the film: percent transmission (% T) and the scattering of light by the film: percent haze (% H). Films with high % T and low % H have better clarity. In some instances the flame retardant film can have a transmission of greater than or equal to about 50% and a haze of less than or equal to about 10% (both determined in accordance with ASTM D1003; "Standard Test Method for Haze and Transmittance of Transparent Plastics"). In other instances % T of greater than or equal to about 75% and percent haze of less than or equal to about 5% is desired. More specifically use of a perfluoro butyl sulfonate salt, for example potassium perfluorobutyl sulfonate, can result in higher clarity and lower haze than other salts.

Referring to FIG. 1, the total flame out time (in seconds (s)) versus thickness (in micrometers (μm)) and versus vacuum pressure (in mbars absolute) are graphically illustrated for polyetherimide films that do not contain sulfonate salt. In the graph for the total flame out time versus thickness, each thickness point is an average of the results obtained at pressures of 85 mbars absolute, 125 mbars absolute, 150 mbars absolute, and 250 mbars absolute. In the graph for the total flame out time versus vacuum pressure, each pressure point is an average of the results obtained at thicknesses of 50 micrometers, 75 micrometers, 100 micrometers, 125 micrometers, 200 micrometers, and 250 micrometers.

As is illustrated in FIG. 1, it was unexpectedly discovered that the pressure employed during the processing of a thermoplastic resin in the formation of a film affects the flame retardancy thereof. By applying a pressure of less than or equal to about 125 mbars absolute, a UL-94 rating of VTM-0 could be attained in the polyetherimide film with no sulfonate salt. For example, a vacuum of about 85 mbars to about 125 mbars can be employed. In this process, the resin pellets would be melt processed in an extruder, or the like, e.g., using a dry vacuum. Once melted, the melt would be subjected to a vacuum pressure of less than or equal to about 125 mbars absolute (e.g., about 110 mbars absolute to about 125 mbars absolute), typically for a short period of time (usually less than or equal to about a minute), and then extruded through the desired die and cooled. Use of the proper shaped die, the correct melt temperature, and the proper cooling roll temperature, results in a film of uniform thickness across its length, as well as a film which has low stress and uniform properties. In one embodiment the resultant film will not change shape excessively (i.e., it will be used substantially as produced) during subsequent operations to incorporate the film into a device. For instance, during metallization of the film and processing of the metallized film to make an electrical circuit.

Figure 2:
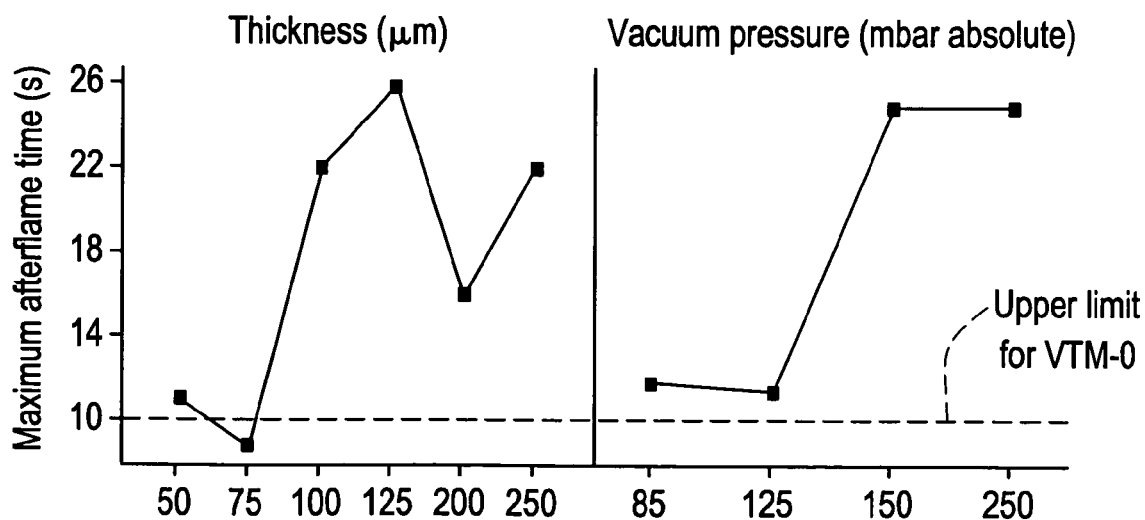
FIG. 2 is a graphical illustration of maximum afterflame time versus thickness and vacuum pressure, this is the highest flame out time for an individual sample among the ten films tested, for a PEI film, as determined in accordance with UL-94 testing standards.

Referring to FIG. 2, the maximum afterflame time (in seconds) versus thickness (in micrometers (μm)) and versus pressure (in millibars (mbars) absolute) are graphically illustrated for polyetherimide films that do not contain sulfonate salt. Each point on this graph is the highest individual flame out time value seen after two applications of flame to the five samples tested at various thicknesses.

Figure 3:
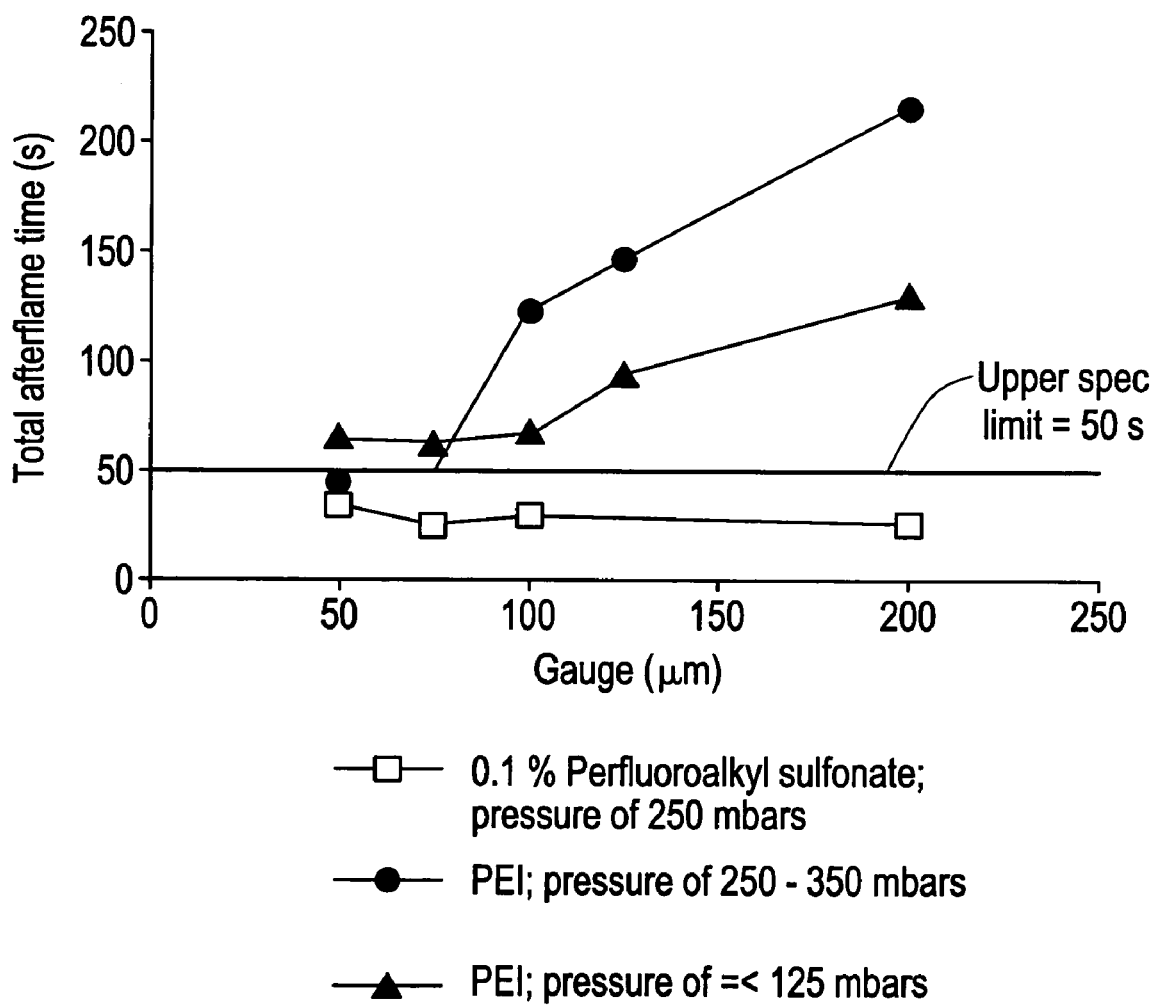
FIG. 3 is a graphical illustration of total flame out time for all samples tested versus thickness and vacuum pressure (as determined in accordance with UL-94 testing standards) to illustrate the effect of vacuum and perfluoroalkyl sulfonate addition in a PEI film. Note that by use of the sulfonate salt total after flame values can be achieved independent of vacuum.

FIG. 3 illustrates the affects of pressure (namely a vacuum of less than or equal to (≦) 125 mbars absolute; and greater than or equal to (≧) 250 mbars absolute) on a PEI film, and the effect of the addition of perfluoroalkyl sulfonate to the PEI film. As can be see from the graph, the sulfonate salt containing film consistently met the UL-94 rating of VTM-0 (TAFT less than 50 seconds) across various thicknesses independent of vacuum (line denoted by open squares). Without the sulfonate salt the TAFT of PEI film increases with increasing thickness (see the two lines indicated by solid circles and solid triangles).

FIG. 3 illustrates that the use of the thermoplastic resin film without sulfonate salt, at thicknesses exceeding 75 micrometers and having been processed with a vacuum pressure of less than or equal to about 125 mbars absolute can reduce the total flame out time of the film by greater than or equal to about 50 seconds, with greater than or equal to about 75 seconds possible, versus a PEI film having the same thickness and no sulfonate salt and with a vacuum of 250-350 mbars absolute; particularly at film thicknesses of greater than 100 micrometers.

FIG. 3 further illustrates that the use of film comprising sulfonate salt can reduce the total flame out time of the film by greater than or equal to about 70 seconds, with greater than or equal to about 100 seconds possible, and greater than or equal to about 150 seconds attainable, versus a PEI film having the same thickness and no sulfonate salt; wherein both films are processed at pressures of greater than or equal to about 250 mbars absolute. This effect is particularly evident at film thicknesses of greater than 75 micrometers. At thicknesses of less than or equal to about 75 micrometers, the use of resin film comprising sulfonate salt can reduce the total flame out time of the film by greater than or equal to about 10 seconds (i.e., by greater than or equal to about 20%), with greater than or equal to about 25 seconds (i.e., by greater than or equal to about 50%) possible, versus a resin film having the same thickness and no sulfonate salt and with a vacuum pressure of 250 to 350 mbars absolute.

Thus a film formed from resin, (e.g., polyimides, polysulfones, and copolymers and mixtures comprising at least one of these resins), with sulfonate salt and/or the use of a vacuum of less than or equal to about 125 mbar during the formation process (preferably melt process), reduces the total flame out time of the resultant film as compared to a same composition film without sulfonate salt (and having the same dimensions) and using a vacuum of greater than or equal to 250 mbars absolute. The use of the sulfonate salt enables the production of a film having a thickness of 25 micrometers to about 250 micrometers and more (with up to and exceeding about 350 micrometers believed possible) that meets UL-94 rating of VTM-0. Further reduction of the afterflame time can be attained with the use of a vacuum of less than or equal to about 125 mbars absolute during the melt processing, alone or in combination with the use of the sulfonate salt.

The unexpected effect of the pressure control, i.e., the use of a vacuum of less than or equal to about 125 mbars absolute (and especially about 100 mbars absolute to about 125 mbars absolute), during the melt processing is believed to have applicability to other thermoplastic resins such that, films produced with those resins, using a vacuum of less than or equal to about 125 mbars absolute (and especially about 100 mbars absolute to about 125 mbars absolute), will result in a reduced afterflame time for the resultant film versus a film of the same composition produced using a vacuum pressure of 250 to 350 mbars absolute. In other words, the vacuum pressure used during the melt processing in the formation of a film can be maintained at a pressure capable of reducing the total flame out time versus a film of the same thermoplastic composition processed at a vacuum pressure of greater than or equal to 250 mbars absolute.

The films produced herein can be used for numerous applications. Exemplary uses include insulation (e.g., cable insulation) and wire wrapping, construction of motors, electronic circuits (especially flexible circuits, transformers, capacitors, coils, switches, separation membranes, computers, electronic and communication devices, telephones, headphones, speakers, recording and/or play back devices, lighting devices, printers, compressors and similar devices), and the like. Optionally, the film can be metallized or partially metallized, as well as coated with other types of coatings designed to enhance physical, mechanical, and/or aesthetic properties, e.g., to improve scratch resistance, surface lubricity, aesthetics, brand identification, structural integrity, and the like. For example, the films can also be coated with printing inks, conductive inks, and similar other materials. Metallization of the flame retardant film, for example, can be done by sputtering, metal vapor deposition, ion plating, arc vapor deposition, electroless plating, vacuum deposition, electroplating, and/or other methods. Additionally, the films can be employed in individual sheets or can be layered, folded, twisted or laminated together to form more complex structures.

In one embodiment, the thermoplastic film can comprise: greater than or equal to about 95 wt % resin selected from the group consisting of polyimides, polyetherimidesulfones, polyimide copolymers, polysulfones, polysulfone copolymers, and mixtures comprising at least one of these resins, and about 0.001 wt % to about 5.0 wt % sulfonate salt, (preferably with a thickness of about 50 micrometers to about 350 micrometers), and a UL-94 rating of VTM-0. Optionally, this film can have a transparency of greater than or equal to about 50% as measured by ASTM D1003, or more specifically, greater than or equal to about 75%, even more specifically, greater than or equal to about 80%, and even more specifically greater than or equal to about 85%. A haze of less than or equal to about 10% as measured by ASTM D1003 can also be attained, or, more specifically, less than or equal to about 5%. Optionally the film can have a $T_g$ of about 180° C. to about 350° C. as measured by ASTM D3418 using differential scanning calorimetry (DSC). This film also can have less than or equal to about 2,500 ppm bromine and/or less than or equal to about 2,500 ppm chlorine, as well as a fluoropolymer in an amount of about 0.01 wt % to about 2.0 wt %. The film can comprise about 0.01 wt % to about 1.0 wt % of the sulfonate salt, or more specifically about 0.025 wt % to about 0.075 wt % sulfonate salt. Optionally, the resin comprises polyetherimide, polyethersulfone, polysulfones, polyethersulfone, polyphenylene ether sulfones and copolymers and combinations comprising at least one of the foregoing resins.

EXAMPLES

Blends of polyetherimide (PEI) resin were prepared on a vacuum vented single screw extruder using 0.1, 0.2, 0.3, 0.4, and 0.5 wt % of a potassium perfluorobutyl sulfonate salts (KPFBS), based upon the total weight of the PEI blend. The extruder was set at 300-360° C. and run at about 80 revolutions per minute (rpm) using vacuum venting. The resultant blend was pelletized, dried, and extruded into clear films of 50, 100, 150, and 200 micrometers (μm) thickness. The PEI resin had a weight average molecular weight of about 38,000 g/mole. $T_g$ was measured by differential scanning calorimetry (DSC) on the second scan.

The films were burned as described in Underwriters Lab (UL) Test Method 94 VTM (UL-94 VTM). Films were tested both in the machine direction (MD) and transverse to the machine direction (TD). The UL-94 VTM tests a film of 200 millimeters (mm) by 50 mm wrapped around a 12.7 mm diameter mandrel. Samples were conditioned at 23° C. and 50% relative humidity for at least 48 hrs, as per the UL-94 test method.

Table 1 reports the total flame out time for the samples with and without the KPFBS salt (for films tested transverse to the direction of extrusion). Films of 50, 100, 150, and 200 micrometers (μm) were tested. There are two aspects of the UL-94 measurement of flammability discussed here. The total flame out time (TFOT) (also know as total after flame time (TAFT)) is the sum of the time, in seconds (s) that all five sample remained ignited after two separate applications of a flame as described in UL-94 VTM test. The average total flameout time (ATFOT) is the TFOT divided by the number of samples. The ATFOT is a per specimen value. The TFOT or TAFT is an aggregate value of all samples tested. In either case shorter time periods indicate better flame resistance, i.e., the flame went out faster. The tables below list average total flame out time (ATFOT). FIGS. 1 and 3 report the TAFT for 5 samples after two application of flame.

High $T_g$ (greater than or equal to 180° C.) was retained in all samples. $T_g$ was measured by DSC on the second scan using a heating rate of 20° C./min.

TABLE 1

| Example | A | 1 | 2 | 3 |
|---|---|---|---|---|
| PEI (wt %) | 100.0 | 99.9 | 99.8 | 99.5 |
| KPFBS (wt %) | 0 | 0.1 | 0.2 | 0.5 |
| $T_g$° C. | 221.8 | 217.4 | 219.3 | 217.4 |
| ATFOT 50 μm (s) | 9.1 | 3.6 | 3.7 | 1.3 |
| ATFOT 100 μm (s) | 8.5 | 8.1 | 4.4 | 3.4 |
| ATFOT 150 μm (s) | 8.8 | 8.0 | 7.3 | 2.6 |
| ATFOT 200 μm (s) | 15.8 | 3.0 | 2.3 | 1.9 |

PEI films tested in the Transverse Direction (TD)

In Table 1, Control Example A shows longer average flame out time, particularly at the thicker films than do the sulfonate salt containing resins, Examples 1, 2, and 3, with the trend being to shorter total flame out time with higher sulfonate salt content. For the Control, ATFOT ranged from 8.5 seconds to 15.8 seconds over thicknesses of 50 μm to 200 μm, while the samples with the sulfonate salt maintained ATFOT of less than or equal to about 8.1 seconds throughout the entire test, with many samples having ATFOT of less than or equal to about 4.0 seconds.

Table 2 shows the same compositions, having the films of the same thickness, 50 micrometers to 200 micrometers, but tested in the machine direction (MD). In most cases, the KPFBS salt was effective in lowering the total flame out time compared to the PEI film with no sulfonate salt added (Example B).

TABLE 2

| Example | B | 4 | 5 | 6 | 7 | 8 |
|---|---|---|---|---|---|---|
| PEI (wt %) | 100.0 | 99.9 | 99.8 | 99.7 | 99.6 | 99.5 |
| KPFBS (wt %) | 0 | 0.1 | 0.2 | 0.3 | 0.4 | 0.5 |
| ATFOT 50 μm (s) | 3.8 | 3.7 | 2.2 | 2.4 | 2.0 | 2.1 |
| ATFOT 100 μm (s) | 5.1 | 4.3 | 6.9 | 2.4 | 2.0 | 2.0 |
| ATFOT 150 μm (s) | 3.5 | 7.8 | 3.0 | 2.4 | 1.4 | 2.0 |
| ATFOT 200 μm (s) | 4.9 | 2.9 | 2.5 | 1.8 | 1.6 | 1.9 |

PEI films tested in the Machine Direction (MD)

Again higher levels of salt were more effective than lower levels in producing films having faster extinguishing times. Additionally, the ATFOT was reduced to less than or equal to 3 seconds for all (PEIS) resin made by polymerization of bisphenol A dianhydride (BPA-DA) with diamino diphenyl sulfone. The polymer had a weight average molecular weight (Mw tested salt concentrations in films 200 μm thick).

For Examples C and 9-11, film extrusion was done using dried polyetherimide sulfone resin on a 1.5 inch unvented single screw extruder, 24:1 length to diameter (L/D) at 320-340° C. at about 35 rpm. Table 3 shows the effectiveness of the sulfonate salt in a polyetherimide sulfone) of about 34,000 g/mole. Samples were tested in the machine direction (MD). Use of the KPFBS salt reduced the total average flame out time as measured by UL-94 VTM method in 50 micrometer and 150 micrometer films, while low haze and high transmission were retained in films with the added sulfonate salt. Percent haze and percent transmission were measured on films as per ASTM D1003 on a Gardner XL-835 colorimeter.

TABLE 3

| Example | C | 9 | 10 | 11 | 12 |
|---|---|---|---|---|---|
| PEIS (wt %) | 100.0 | 99.9 | 99.85 | 99.8 | 99.7 |
| KPFBS (wt %) | 0 | 0.1 | 0.15 | 0.2 | 0.3 |
| Haze 50 μm (%) | 0.8 | 0.8 | 0.8 | 0.4 | 0.4 |
| Haze 150 μm (%) | 7.5 | 5.1 | 4.4 | 3.7 | 6.7 |
| Transmission 50 μm (%) | 87.2 | 87.3 | 87.6 | 87.4 | 86.9 |
| Transmission 150 μm (%) | 86.2 | 85.9 | 86.3 | 86.6 | 86.4 |
| ATFOT 50 μm (s) | 6.1 | 5.2 | 5.4 | 2.5 | 3.7 |
| ATFOT 150 μm (s) | 2.2 | 0.2 | 2.2 | 1.8 | 1.8 |

PEIS films tested in the Machine Direction (MD)

For Examples D and 13-15, film extrusion was done using dried PEIS resin on a 1.5 inch unvented single screw extruder, 24:1 L/D at 340-370° C. at about 35 rpm. Table 4 shows the same polyetherimide sulfone samples as Table 3 tested in the transverse direction (TD). Addition of the KPFBS salt reduced flame out time. Compared to the control (without sulfonate salt), 50 μm samples with sulfonate salt, tested in the transverse direction, had a haze of less than or equal to 5%, a transmission of greater than or equal to 85% (a change in transmission of less than or equal to about 1%, more specifically, less than or equal to about 0.5%), and a ATFOT of less than or equal to 5 seconds.

TABLE 4

| Example | D | 13 | 14 | 15 |
|---|---|---|---|---|
| PEIS wt % | 100.0 | 99.9 | 99.8 | 99.7 |
| KPFBS wt % | 0 | 0.1 | 0.2 | 0.3 |
| Haze 50 μm (%) | 0.8 | 0.8 | 0.4 | 0.4 |
| Transmission 50 μm (%) | 87.2 | 87.3 | 87.4 | 86.9 |
| ATFOT 50 μm (s) | 6.8 | 3.8 | 2.0 | 1.2 |

PEIS films tested in the Transverse Direction (TD)

Table 5 shows the effectiveness of the KPFBS salts in improving UL-94 VTM performance in a polyethersulfone (PES) resin blend. ULTRASON E polymer from BASF Co. was extruded with 0.5 wt % KPFBS salt, based on the total weight of the PES blend. Samples were tested in the machine direction (MD). The resultant pellets were dried and extruded into films of 50 micrometers and 150 micrometers. As can be seen in Control Example E and in Example 16 the sulfonate salt containing blend has reduced average total flame out time while maintaining high $T_g$, low haze, and high transmission.

In other words, with the use of the sulfonate salt, total flame out times for films tested in the machine direction, having a thickness of about 50 μm to about 200μm, ATFOT is less than or equal to 5.5, more specifically, less than or equal to 5.0. Additionally, a transmission of greater than or equal to about 80%, specifically, greater than or equal to about 85% was retained (i.e., a change in transmission from a resin without the salt to a resin with the salt was less than or equal to about 0.1%), and a haze of less than or equal to about 5% was retained, more specifically, less than or equal to about 2%, and even less than or equal to about 1%.

TABLE 5

| Example | E | 16 |
|---|---|---|
| PES (wt %) | 100.0 | 99.5 |
| KPFBS (wt %) | 0 | 0.5 |
| $T_g$ ° C. | 226.3 | 225.9 |
| Haze 50 μm (%) | 0.7 | 0.9 |
| Haze 150 μm (%) | 1.8 | 1.1 |
| Transmission 50 μm (%) | 88.7 | 88.8 |
| Transmission 150 μm (%) | 87.8 | 87.9 |
| ATFOT 50 μm (s) | 9.4 | 2.4 |
| ATFOT 150 μm (s) | 6.7 | 5.0 |

PES films tested in the Machine Direction (MD)

For Examples F and 17, film extrusion was done using dried polyether sulfone resin on a 1.5 inch unvented single screw extruder, 24:1 L/D at 320-340° C. at about 35 rpm. Table 6 shows the same polyethersulfone samples as in Table 5 tested in the transverse direction (TD). Addition of the KPFBS salt reduced flame out time. For films with the salt, the ATFOT was less than or equal to 5.0 seconds, for films having thicknesses up to about 200 μm.

TABLE 6

PES TD VTM Total Flame Out Times

| Example | F | 17 |
|---|---|---|
| PES (wt %) | 100.0 | 99.5 |
| KPFBS (wt %) | 0 | 0.5 |
| $T_g$° C. | 226.3 | 225.9 |
| Haze 50 μm (%) | 0.7 | 0.9 |
| Haze 150 μm (%) | 1.8 | 1.1 |
| Transmission 50 μm (%) | 88.7 | 88.8 |
| Transmission 150 μm (%) | 87.8 | 87.9 |
| ATFOT 50 μm (s) | 7.8 | 4.0 |
| ATFOT 150 μm (s) | 7.8 | 4.0 |

PES films tested in the Transverse Direction (TD)

The incorporation of sulfonate salt(s) in to a thermoplastic resin, namely PEI, PEIS, and PES, has unexpectedly reduced average total flame out time of the resin versus these thermoplastic resins without the sulfonate salt, while retaining transmission and haze properties, as well as retaining a $T_g$ of greater than or equal to 180° C., more specifically, $T_g$ of greater than or equal to about 200° C.

Flame retardancy was achieved without impairing melt stability and melt processability while simultaneously retaining clarity, high % T, low % H and high heat resistance ($T_g$) clarity.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A film, comprising:
   greater than or equal to about 95 wt % thermoplastic resin, based on a total weight of the film, wherein the thermoplastic resin is selected from the group consisting of polyimide, polyetherimide, polyetherimide sulfone, and copolymers, reaction products, and combinations comprising at least one of the foregoing thermoplastic resins; and
   about 0.001 wt % to about 5.0 wt % of a fluoroalkyl sulfonate salt, based on the total weight of the film; wherein the film has a UL-94 rating of VTM-0 and further wherein less than or equal to 2,500 parts per million by weight of bromine is present.

2. The film of claim 1, further comprising a percent transmission of greater than or equal to about 50% as measured by ASTM D1003.

3. The film of claim 2, wherein the percent transmission is greater than or equal to about 75%.

4. The film of claim 2, further comprising a haze of less than or equal to about 10% as measured by ASTM D1003.

5. The film of claim 1, further comprising less than or equal to about 1,000 ppm bromine.

6. The film of claim 1, further comprising less than or equal to about 1,000 ppm chlorine.

7. The film of claim 1, further comprising a $T_g$ of about 180° C. to about 350° C. as measured by ASTM D3418.

8. The film of claim 1, further comprising a fluoropolymer in an amount of about 0.01 wt % to about 2.0 wt %, based on the total weight of the film.

9. The film of claim 1, wherein the fluoroalkyl sulfonate is represented by Formula (I), $$(R'-SO_3)_xM \qquad \text{Formula (I)}$$

Where R' is $C_1$-$C_{40}$ fluoroalkyl; M is a metal selected from the group consisting of an alkali metal, an alkaline earth metal, and combinations comprising at least one of the foregoing metals; and x is the oxidation state of M.

10. The film of claim 1, wherein the fluoroalkyl sulfonate salt is perfluorobutyl potassium sulfonate salt.

11. The film of claim 1, wherein the fluoroalkyl sulfonate salt comprises a perfluoroalkyl (alkali metal/alkaline earth metal) sulfonate salt.

12. The film of claim 1, wherein the floroalkyl sulfonate salt comprises perfluorobutyl potassium sulfonate salt.

13. The film of claim 1, wherein the perfluroalkyl (alkali metal/alkaline earth metal) sulfonate salt has less than or equal to eight carbon atoms.

14. The film of claim 1, comprising about 0.025 wt % to about 3.0 wt % of the floroalkyl sulfonate salt.

15. The film of claim 14, comprising about 0.05 wt % to about 1.0 wt % of the floroalkyl sulfonate salt.

16. The film of claim 1, wherein the thermoplastic resin comprises polyetherimide sulfones.

17. The film of claim 1, wherein the thermoplastic resin comprises polyetherimide.

18. The film of claim 1, wherein the film has a thickness of about 50 micrometers to about 300 micrometers.

19. The film of claim 1, wherein the film is metallized.

20. A method for producing a film, comprising:
   melting a thermoplastic resin and a fluoroalkyl sulfonate salt to form a melt, wherein the thermoplastic resin is selected from the group consisting of polyimide, polyetherimide, polyetherimide sulfone, and copolymers, reaction products, and combinations comprising at least one of the foregoing thermoplastic resins, and wherein the thermoplastic resin is present in an amount of greater than or equal to about 95 wt %, and the floroalkyl sulfonate salt is present in an amount of about 0.001 wt % to about 5.0 wt %, based upon the total weight of the melt and less than or equal to 2,500 parts per million by weight of bromine is present; and
   passing the melt through a die to produce the film.

21. The method of claim 20, further comprising applying a vacuum to the melt at a vacuum pressure of less than or equal to about 125 mbars absolute.

22. The method of claim 21, wherein the vacuum pressure is about 110 mbars absolute to about 125 mbars absolute.

23. A method for producing a thermoplastic film using melt processing, comprising:
   melting a composition comprising thermoplastic resin selected from the group consisting of polyimide, polyetherimide, polyetherimide sulfone, and copolymers, reation products, and combinations comprising at least one of the foregoing thermoplastic resins and a fluoroalkyl sulfonate salt to form a melt;
   applying a sufficient vacuum to the melt to reduce a film total flame out time determined in accordance with UL-94, by greater than or equal to about 10 seconds as compared to an original total flame out time attained from a film having the same composition and an application of a vacuum of greater than or equal to 250 mbar; and passing the melt through a die to produce the film.

24. The method of claim 23, wherein the vacuum pressure is about 110 mbars absolute to about 125 mbars absolute.

25. The method of claim 23, wherein the film total flame out time is reduced by greater than or equal to about 50 seconds.

\* \* \* \* \*